US012375860B2

(12) United States Patent
Freedman et al.

(10) Patent No.: US 12,375,860 B2
(45) Date of Patent: Jul. 29, 2025

(54) ELECTRET CAPSULE

(71) Applicant: FREEDMAN ELECTRONICS PTY LIMITED, Silverwater (AU)

(72) Inventors: Peter Freedman, Silverwater (AU); Pieter Schillebeeckx, Silverwater (AU)

(73) Assignee: Freedman Electronics Pty Limited, Silverwater (AU)

( * ) Notice: Subject to any disclaimer, the term of this patent is extended or adjusted under 35 U.S.C. 154(b) by 128 days.

(21) Appl. No.: 18/044,456

(22) PCT Filed: Sep. 21, 2021

(86) PCT No.: PCT/AU2021/051101
§ 371 (c)(1),
(2) Date: Mar. 8, 2023

(87) PCT Pub. No.: WO2022/056610

PCT Pub. Date: Mar. 24, 2022

(65) Prior Publication Data
US 2023/0292056 A1 Sep. 14, 2023

(30) Foreign Application Priority Data

Sep. 21, 2020 (AU) ................ 2020903377

(51) Int. Cl.
*H04R 19/01* (2006.01)
*H03K 17/687* (2006.01)
(Continued)

(52) U.S. Cl.
CPC ....... *H04R 19/016* (2013.01); *H03K 17/6871* (2013.01); *H04R 1/04* (2013.01);
(Continued)

(58) Field of Classification Search
CPC . H04R 1/04; H04R 1/086; H04R 3/00; H04R 7/04; H04R 2410/03; H04R 17/00;
(Continued)

(56) References Cited

U.S. PATENT DOCUMENTS 4,764,690 A 8/1988 Murphy et al.
5,589,799 A * 12/1996 Madaffari ............. H03F 3/1855
330/277
(Continued)

FOREIGN PATENT DOCUMENTS

CN 110798786 A * 2/2020 ............. H04R 19/01
JP 2006-245740 A 9/2006

OTHER PUBLICATIONS

International Search Report and Written Opinion of the International Searching Authority for International Patent Application No. PCT/AU2021/051101 dated Dec. 20, 201, 15 pages.

*Primary Examiner* — Ahmad F. Matar
*Assistant Examiner* — Sabrina Diaz
(74) *Attorney, Agent, or Firm* — Lathrop GPM LLP; Alex Shtraym

(57) ABSTRACT

The present invention relates generally to the field of electret capsule, and more particularly to a circuit configuration of an impedance converter integrated in an electret capsule such as for use in condenser microphones. The electret capsule of a microphone may include a gate biasing field effect transistor (FET) to facilitate biasing of a low noise FET. Advantageously, the use of low noise FET in the electret capsule of a microphone provides for a reduced cost, while achieving lower self-noise.

8 Claims, 7 Drawing Sheets

(51) Int. Cl.
*H04R 1/04* (2006.01)
*H04R 1/08* (2006.01)
*H04R 3/00* (2006.01)
*H04R 7/04* (2006.01)

(52) U.S. Cl.
CPC .............. *H04R 1/086* (2013.01); *H04R 3/00* (2013.01); *H04R 7/04* (2013.01); *H04R 2410/03* (2013.01)

(58) Field of Classification Search
CPC ...... H04R 17/02; H04R 19/016; H04R 19/00; H04R 19/01; H04R 19/04; H03K 17/6871
USPC .......................................... 381/94.6, 191, 113
See application file for complete search history.

(56) References Cited

U.S. PATENT DOCUMENTS

| | | | |
|---|---|---|---|
| 7,223,136 B2 | 5/2007 | Yamamoto et al. | |
| 7,907,743 B2 | 3/2011 | Izuchi et al. | |
| 2003/0161491 A1* | 8/2003 | Yonehara | H04R 19/01 381/174 |
| 2005/0002538 A1 | 1/2005 | Yonehara et al. | |
| 2007/0104339 A1 | 5/2007 | Izuchi et al. | |
| 2013/0058506 A1 | 3/2013 | Boor | |
| 2018/0234764 A1 | 8/2018 | Gabai | |

\* cited by examiner

ELECTRET CAPSULE

CROSS-REFERENCE TO RELATED APPLICATIONS

This application is a National Stage Application of PCT/AU2021/051101, filed 21 Sep. 2021, which claims benefit of Serial No. 2020903377, filed 21 Sep. 2020 in Australia, and which applications are incorporated herein by reference. To the extent appropriate, a claim of priority is made to each of the above-disclosed applications.

FIELD OF THE INVENTION

The present invention relates generally to the field of electret capsules, and more particularly to a circuit configuration of an impedance converter integrated in an electret capsule such as for use in pre-polarised condenser microphones.

BACKGROUND

Electret capsules are commonly used within microphone designs and are readily available. However, with the development of micro-electromechanical systems (MEMS) capsules, electret capsules have started to fall out of favor—MEMS capsules are cheaper to produce, and so have replaced electret capsules in a majority of their applications. MEMS capsules, however, suffer from greater noise and are not readily available with directional polar response. Although the effect is insufficient to be a problem for consumer electronics, the signal output quality of high-end microphones such as those used by professionals suffer noticeably With the growing popularity of MEMS capsules the supply of electronic components to create low-noise high performance electret capsules has rapidly decreased.

Therefore, there is a need for an alternative approach to electret capsule circuitry that is suitable for use in high-end microphones and provide either equivalent or improved functionality over traditional prior art electret capsules. The present invention satisfies this need.

SUMMARY

The present invention relates generally to the field of electret capsules, and more particularly to a circuit configuration of an impedance converter integrated in an electret capsule such as for use in pre-polarised condenser microphones.

As detailed below, an electrical circuit of the electret capsule may comprise one or more field-effect transistors (FETs), diodes (such as a zener diode), resistors, capacitors, and inductors.

In one aspect the present invention provides an electret capsule for use in a microphone, comprising one or more field-effect transistors (FETs), biasing diodes, and biasing resistors arranged within an electrical circuit.

In another aspect, the positioning of the biasing diodes and biasing resistors within the electrical circuit may be configured to provide a combined "hybrid bias" upon the FET. Whereas diode biasing provides excellent noise reduction and signal gain but lacks in temperature stability, and resistor biasing provides temperature stability but does not provide any improvement on noise reduction, it is considered that a hybrid biasing configuration provides a synergistic combination of the two prior art biasing forms.

In yet another aspect, the electret capsule may further comprise a "capsule FET" within the electrical circuit, the positioning of which may be configured to bias the FET. In one embodiment, the capsule FET may be in addition to the biasing resistor. In an alternate embodiment, the capsule FET may replace the biasing resistor in the electrical circuit.

In a further aspect, the electret capsule may comprise an inductor within the electrical circuit with one or more capacitors in series. The arrangement of the inductor and capacitors may facilitate improved noise rejection of the circuit with regards to an output signal.

While the invention is susceptible to various modifications and alternative forms, specific exemplary embodiments thereof have been shown by way of example in the drawings and have herein been described in detail. It should be understood, however, that there is no intent to limit the invention to the particular embodiments disclosed, but on the contrary, the intention is to cover all modifications, equivalents, and alternatives falling within the scope of the invention as defined by the appended claims.

BRIEF DESCRIPTION OF THE DRAWINGS

Embodiments are illustrated by way of example and not limitation in the figures in the accompanying drawings, in which like references indicate similar elements and in which.

DETAILED DESCRIPTION OF THE INVENTION

The present invention relates generally to the field of electret capsules, and more particularly to a circuit configuration of an impedance converter integrated in an electret capsule such as for use in pre-polarised condenser microphones. The electret capsule of a microphone may include a gate biasing field effect transistor (FET) to facilitate biasing of a low noise FET. Advantageously, the use of a low noise FET in the electret capsule of a microphone provides for improved temperature stability, while achieving lower self-noise.

Figure 1A:
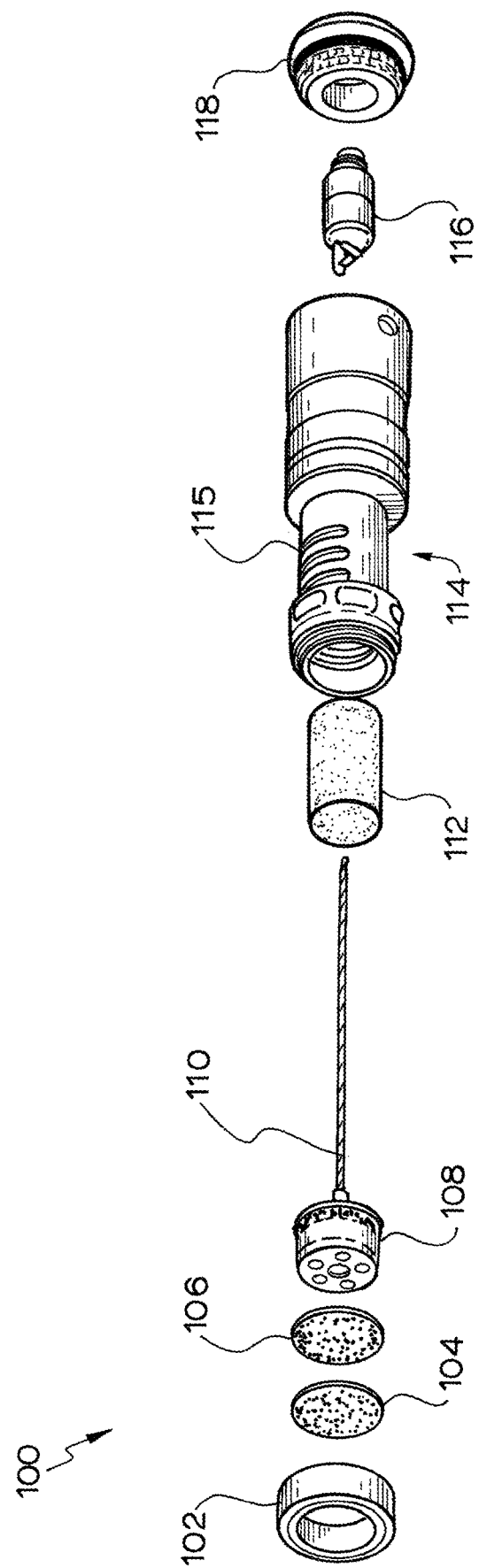
FIG. 1A illustrates an exploded view of an exemplary microphone assembly including an electret capsule.

Turning now to the drawings wherein like numerals represent like components, FIG. 1A illustrates an exemplary microphone assembly 100. As shown, microphone assembly 100 may include a front cap 102, a coarse mesh 104, a fine mesh 106, an electret condenser capsule 108, a wire assembly 110, a protection mesh 112, a body 114, an audio connector 116, and a rear cap 118. It is contemplated that any type of microphone or microphone element may be used, such as for example, uni-directional or omni-directional microphones.

As illustrated, components of microphone 100 may be housed between front cap 102 and rear cap 118 within body 114. While body 114 is shown to be substantially tubular, other shapes are contemplated. As shown, body 114 may include one or more openings 115 to permit sound waves to enter. Body 114 and front/rear caps 102, 118 may be made of the same materials or different materials, such as metal, plastic or the like.

As mentioned above, microphone 100 may include one or more layers of mesh 104, 106, 112. The one or more mesh layers may be used to adjust the acoustic impedance properties of microphone 100 and may prevent intrusion of foreign matter and fine particles. Examples of mesh materials that may be used include nonmetallic (e.g., nonconductive) materials such as woven polyester and PVC-on-polyester fabrics. In general, mesh material may be formed from any suitable fabric material that exhibits acceptable acoustic performance, such as for example, sound transparency of 90% or more.

Figure 1B:
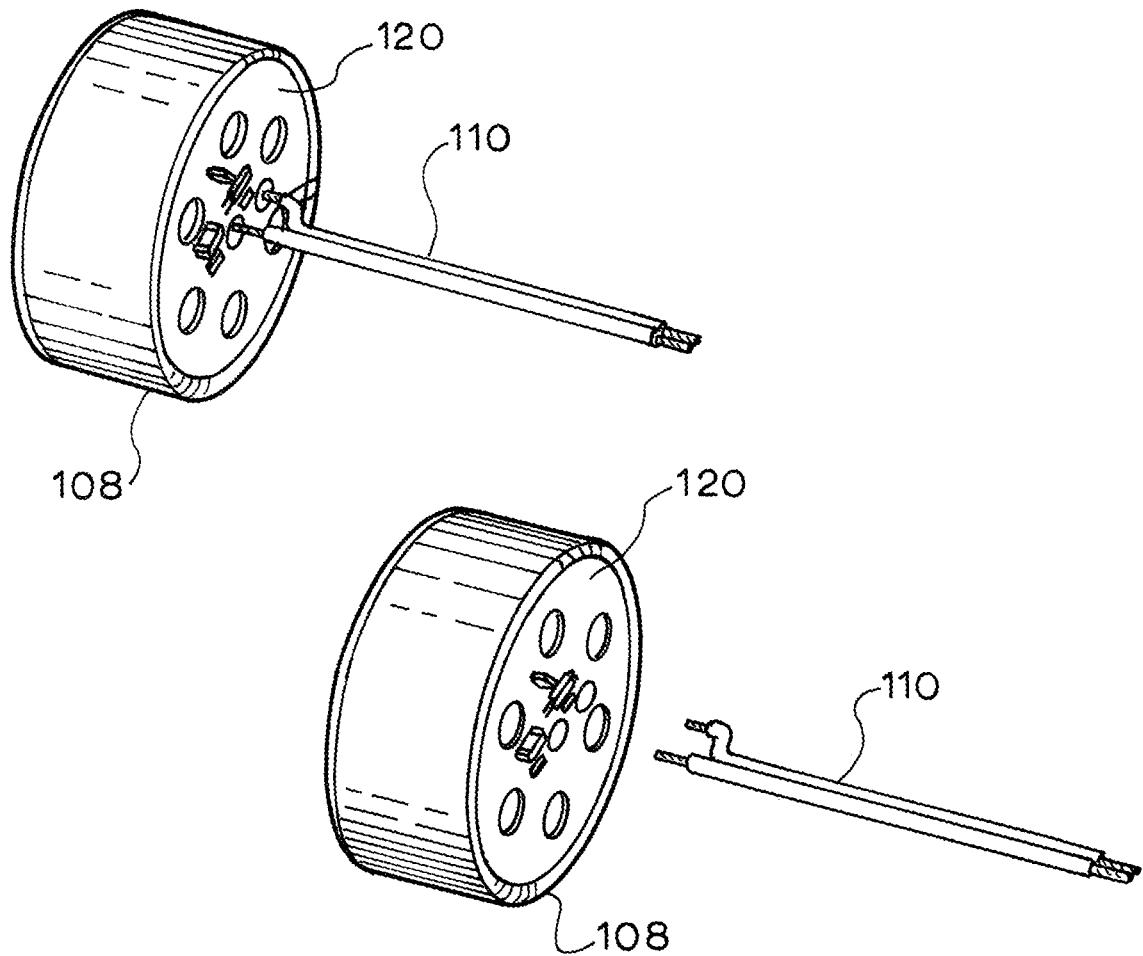
FIG. 1B illustrates an exemplary connection of the electret capsule of FIG. 1A.
Figure 2A:
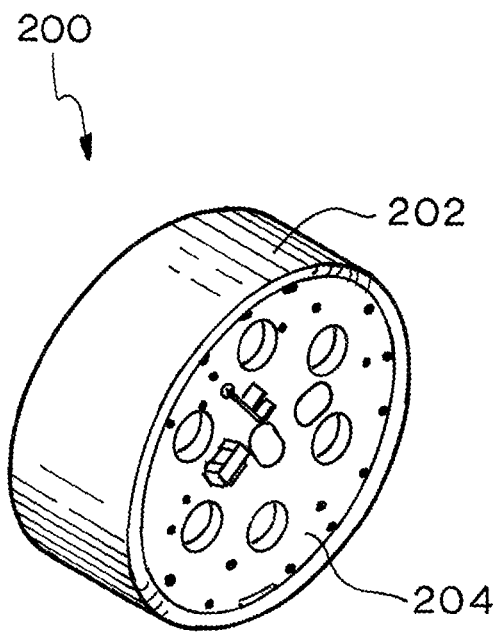
FIG. 2A illustrates a perspective view of an exemplary electret capsule coupled with an exemplary printed circuit board (PCB)
Figure 2B:
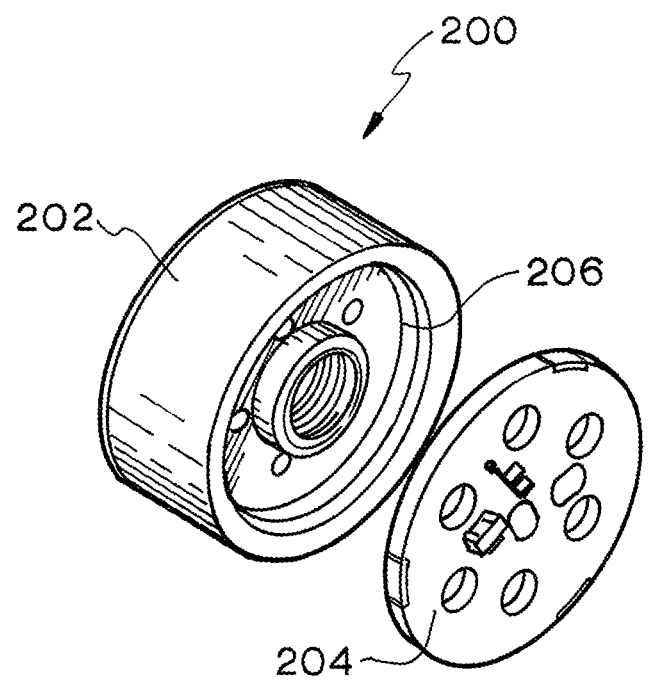
FIG. 2B illustrates a perspective view of the electret capsule decoupled from the PCB of FIG. 2A.
Figure 2C:
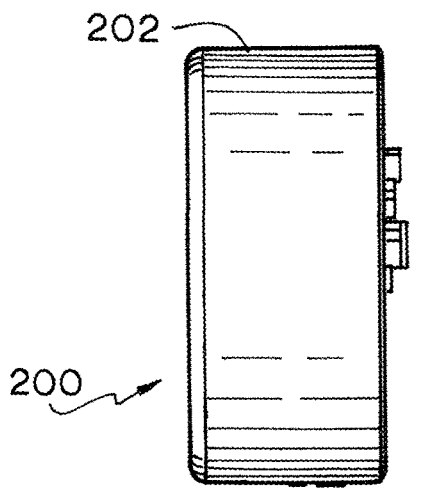
FIG. 2C illustrates a side view of the electret capsule of FIG. 2A.
Figure 2D:
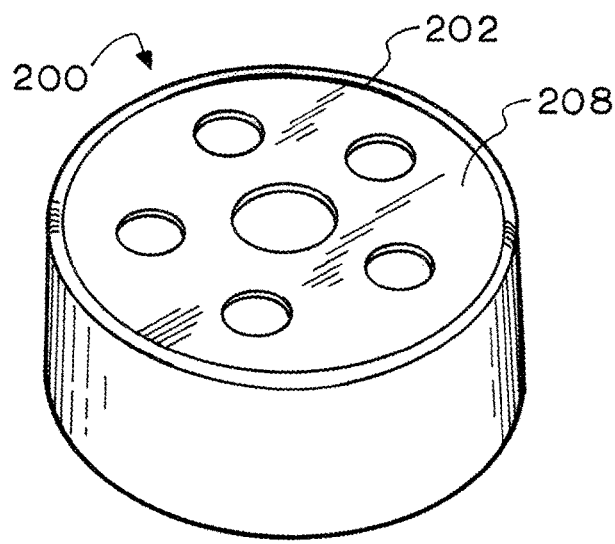
FIG. 2D illustrates a bottom view of the electret capsule of FIG. 2A.
Figure 2E:
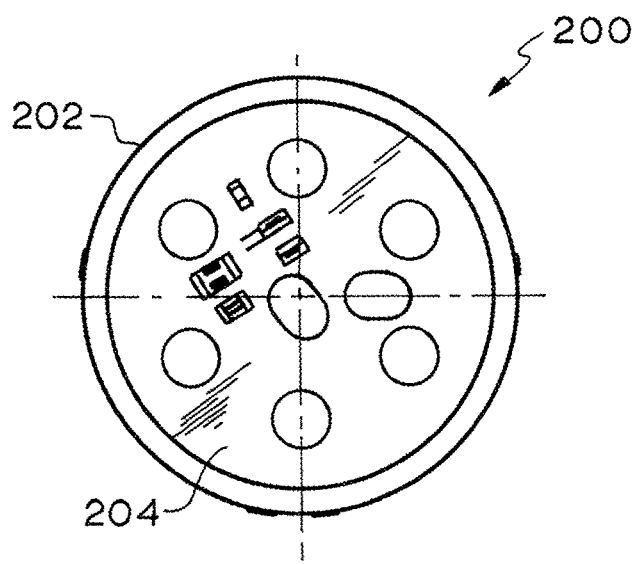
FIG. 2E illustrates a top view of the electret capsule and PCB of FIG. 2A.

As shown in FIGS. 1A-1B, microphone 100 may further include an electret capsule 108 connected to an audio interface 116 via a wire 110. Electret capsule 108 may include a biasing arrangement of field effect transistors to achieve low noise, as detailed below. While a wire is shown, other connection types are contemplated such as a pin connection or terminal connection. As shown in FIG. 1B, wire 110 may be soldered onto a printed circuit board 120 of the electret capsule 100.

Audio connector 116 may facilitate transmitting audio signals, such as analog or digital frequencies to, for example, a speaker. In one instance, audio connector 116 may be an XLR connector having between three and seven pins.

FIGS. 2A-2E illustrate an exemplary electret capsule 200. As shown, electret capsule 200 may include a housing 202 and a printed circuit board (PCB) 204. Housing 202 may include a top surface 206 and a bottom surface 208. As shown, a PCB 204 may couple with top surface 206, such as via a contact spring as detailed below.

Although electret capsule 200 is not limited to specific dimensions, the width of housing 202 may range between about four millimeters and about eight millimeters and preferably between about five millimeters and about seven millimeters. In one embodiment, housing 202 is about six and three tenths millimeters in width. The diameter of electret capsule 200 may range between about four millimeters and about twenty millimeters and preferably between about twelve millimeters and about sixteen millimeters. In one embodiment, the diameter of electret capsule 200 is about fourteen millimeters.

Figure 3:
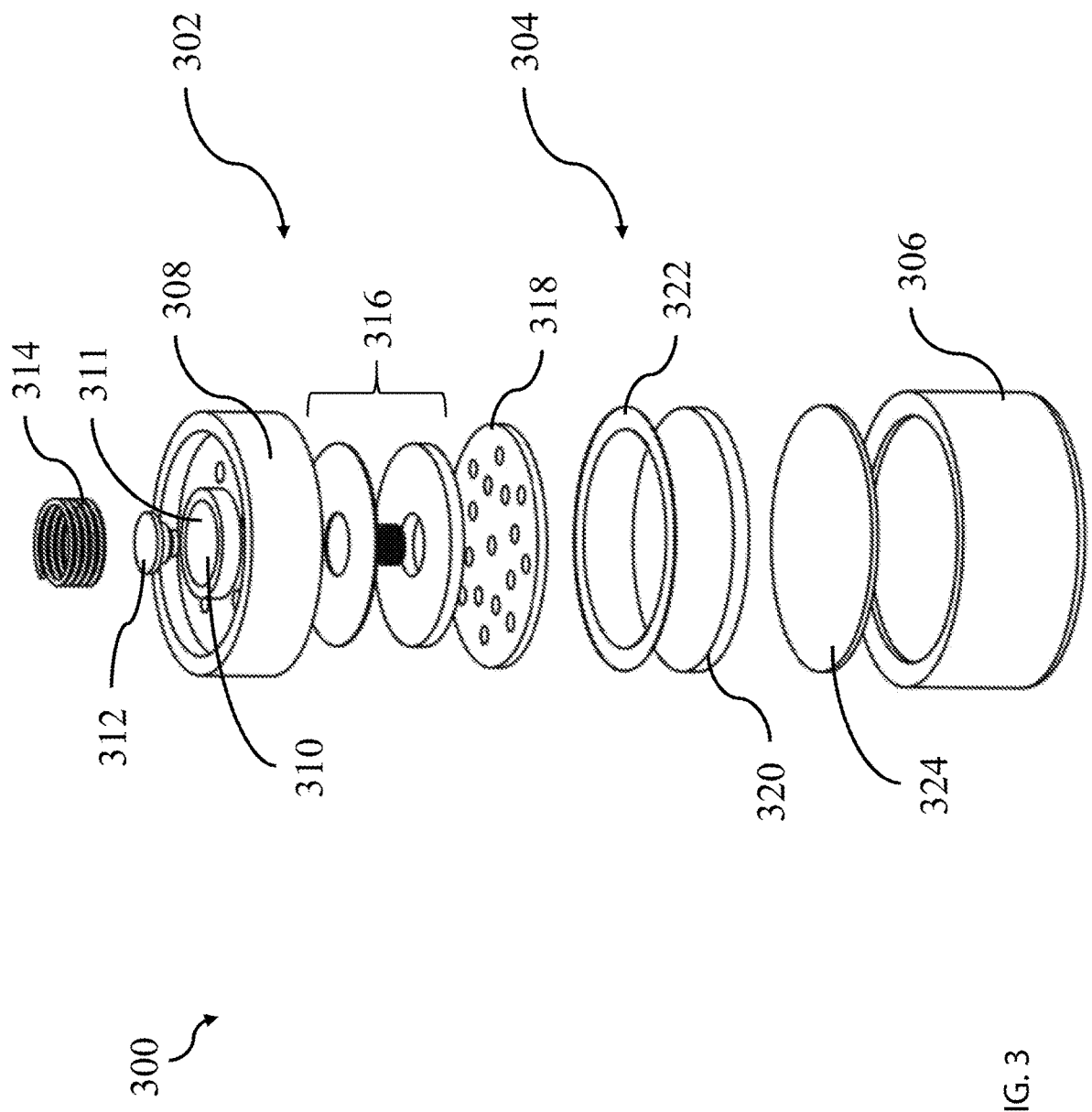
FIG. 3 illustrates an exploded view of an exemplary electret capsule.

FIG. 3 illustrates an exploded view of an exemplary electret capsule 300. As shown, electret capsule 300 may include a backplate assembly 302, a diaphragm assembly 304, and a housing 306. Housing 306 may be configured to hold the components of assemblies 302, 304.

Backplate assembly 302 may include a support member 308. Support member 308 may include an opening 310 defined by one or more interior walls 311. An electrically conducting rod 312 may be slidably disposed within opening 310. A contact spring 314 is disposed about rod 312 in abutment with the interior walls of opening 310. Spring 314 may facilitate electrical contact between the rod and damping discs 316, which may be in contact with a backplate 318. Damping discs 316 may be constructed of non-conductive porous material such as non-woven fabrics or foams.

Backplate 318 may be a conductive perforated disc coated in an electret material such as polytetrafluoroethylene (PTFE), which is given a permanent polarization charge. Although not shown in FIG. 3, backplate 318 may be electrically connected to a printed circuit board (PCB) via spring 314.

Backplate 318 also may be electrically isolated from a diaphragm 320 of assembly 304 via a non-conductive gasket 322. Diaphragm 320 may be constructed of a flexible material that is configured to vibrate in response to sound waves. For example, diaphragm 320 may be a flexible film forming a vibratile diaphragm which will respond to sound waves passing through a mesh 324. Diaphragm 320 may be electrostatically polarized such that vibrations in response to sound waves result in an alternating potential being developed between the diaphragm 320 and the backplate 318. In addition, backplate 318 may include a plurality of apertures, which contribute to the level of volume between the diaphragm 320 and backplate 318.

Figure 4:
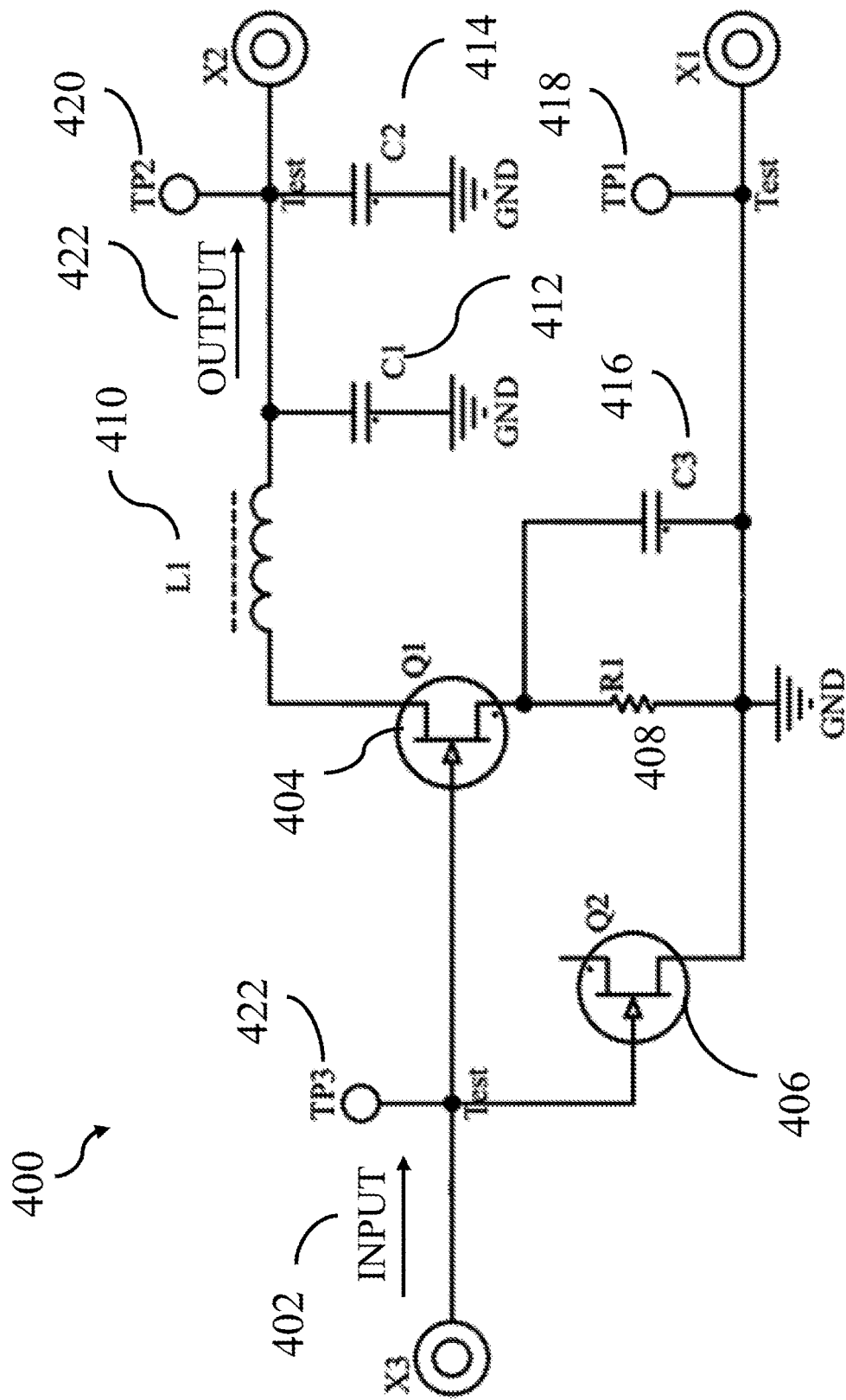
FIG. 4 illustrates an exemplary electret capsule circuit configuration.
Figure 5:
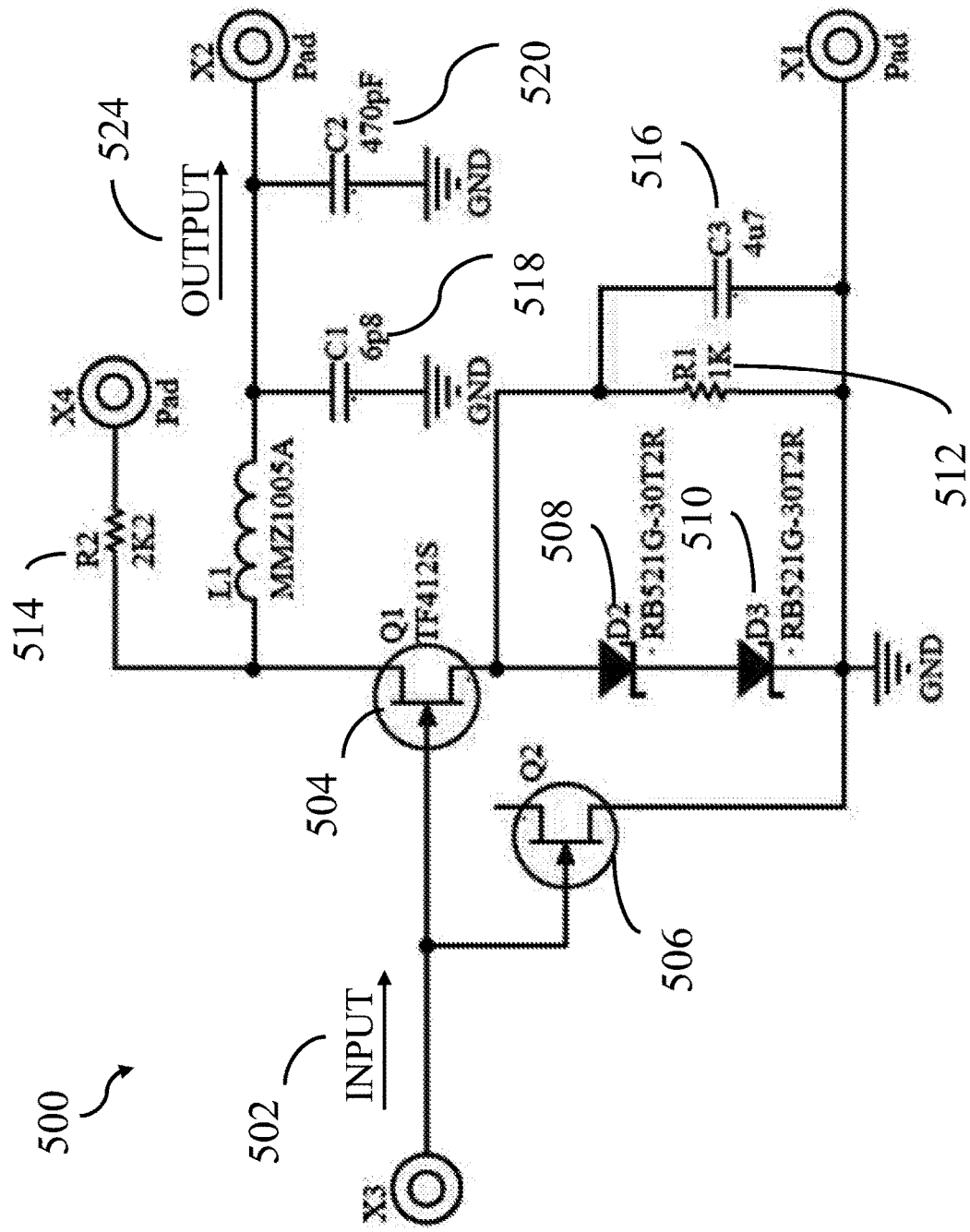
FIG. 5 illustrates another exemplary electret capsule circuit configuration.

FIGS. 4 and 5 illustrates exemplary circuits 400, 500 of an electret capsule including one or more field-effect transistors (FETs), biasing diodes, and biasing resistors arranged within an electrical circuit. It is further contemplated that the capsule may be a kind of a capsule which needs a polarization power supply.

As illustrated in FIG. 4 and FIG. 5, an electret capsule may include a gate biasing field effect transistor (FET) to facilitate biasing of a low noise FET. Advantageously, the use of low noise FET in an electret capsule provides for a reduced cost, while achieving lower self-noise.

As illustrated in FIG. 4, exemplary circuit 400 may include two FETs or junction field effect transistor (J-FETs) 404, 406, a resistor 408, and inductor 410, three capacitors 412, 414, 416, and three test points 418, 420, 422. Each FET 404, 406 includes a source, a drain, and a gate electrode.

As shown in FIG. 4, FETs 404, 406 may be arranged according to a biasing arrangement such that first FET 404 may be an impedance converter low noise FET and said FET 406 may be a gate biasing FET. An input 402 is provided to the gate electrodes of the first FET 404 and second FET 406. The source electrode of the first FET 404 is connected to source electrode of the second FET 406 and ground through resistor 408. Capacitor 416 may be configured as a bypass capacitor in parallel with resistor 408.

The drain electrode of first FET 404 may be connected to ground by inductor 410 and one or more bypass capacitors 412, 414 in series. The arrangement of the inductor 410 and capacitors 412, 414 may facilitate improved noise rejection of the circuit with regards to an output signal 422. Since second FET 406 is used for biasing first FET 404, the drain electrode of second FET 406 is open.

As illustrated in FIG. 5, exemplary circuit 500 may include two FETs 504, 506, two voltage reference diodes (e.g., zener diodes) 508, 510, two resistors 512, 514, three capacitors 516, 518, 520, and an inductor 522. Each FET 504, 506 (which may be a J-FET) includes a source, a drain, and a gate electrode.

As shown, FETs 504, 506 may be arranged according to a biasing arrangement such that first FET 504 may be an impedance converter low noise FET and said FET 506 may be a gate biasing FET. An input signal 502 may be provided to the gate electrodes of the first FET 504 and second FET 506.

The source electrode of the first FET 504 is connected to the source electrode of second FET 506 and ground through two zener diodes 508, 510 such that a positive bias potential is established at the source. In one embodiment, zener diodes 508, 510 may be a schottky diode.

Zener diodes 508, 510 may be connected in parallel with resistor 512 and capacitor 516. The positioning of the biasing diodes and biasing resistors within the electrical circuit may be configured to provide a combined "hybrid bias" upon the FETs 504, 506. While resistor 512 is shown to have a resistance of 1K, the value may be varied so as to compensate for variations in the characteristics of FETs 504, 506.

The drain electrode of first FET 504 may be connected to ground by inductor 522 and one or more bypass capacitors 518, 522 in series. The arrangement of the inductor 522 and capacitors 518, 520 may facilitate improved noise rejection of the circuit with regards to an output signal 524.

The drain electrode of first FET 504 may also be connected in series with resistor 514, which may be configured as a current limiting resistor. Since second FET 506 is used for biasing first FET 504, the drain electrode of second FET 506 is open.

As illustrated in FIG. 4 and FIG. 5, a gate biasing FET or J-FET may facilitate the biasing of a low noise FET or J-FET, thereby avoiding the need for cost and size prohibitive components otherwise required to achieve said biasing. Doing so enables the use of low noise J-FET in an electret capsule microphone at a reduced cost, while achieving lower self-noise.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described in the application are to be taken as examples of embodiments. Components may be substituted for those illustrated and described in the application, parts and processes may be reversed, and certain features of the invention may be utilized independently, all as would be apparent to one skilled in the art after having the benefit of this description of the invention. Changes may be made in the elements described in the application without departing from the spirit and scope of the invention as described in the following claims.

The invention claimed is:

1. An electret capsule comprising:
a biasing arrangement of two or more field effect transistors (FETs), each FET including a source electrode, a drain electrode, and a gate electrode;
a backplate assembly including a backplate, an acoustic housing, one or more damping discs, and a contact spring;
a diaphragm assembly coupled to said backplate assembly via a gasket; and
an external housing including a protection mesh;
wherein the biasing arrangement comprises the source electrode of at least a first FET of the two or more FETs being in electrical connection with the source electrode of at least a second FET of the two or more FETs, said first FET being an impedance converter low noise FET, said second FET being a gate biasing FET including an open drain configuration and configured to facilitate biasing said first FET.

2. The electret capsule of claim 1, wherein said backplate is connected to a printed circuit board (PCB) via the contact spring.

3. The electret capsule of claim 1, further comprising a connector, wherein said connector is at least one of a PCB pin, a wire lead, and a terminal.

4. The electret capsule of claim 1, further comprising biasing diodes configured to reduce noise and signal gain, said diodes connected in series and arranged to connect said first FET and said second FET to ground to facilitate a positive bias potential.

5. The electret capsule of claim 4, wherein said biasing diodes are at least one of a zener diode and a schottky diode.

6. The electret capsule of claim 1, further comprising a biasing resistor including a first terminal connected in series to said source electrode of said first FET and a second terminal connected to ground.

7. The electret capsule of claim 6, wherein said resistor has a resistance value of about 1KΩ to facilitate compensating for variations in output characteristics of said two or more FETs.

8. The electret capsule of claim 1, further comprising a noise rejection configuration for an output signal, said configuration including an inductor having a first terminal connected in series to said drain electrode of said first FET and a second terminal in series with a first capacitor and a second capacitor.

* * * * *